US006552941B2

(12) United States Patent
Wong et al.

(10) Patent No.: US 6,552,941 B2
(45) Date of Patent: Apr. 22, 2003

(54) METHOD AND APPARATUS FOR IDENTIFYING SRAM CELLS HAVING WEAK PULL-UP PFETS

(75) Inventors: Robert C. Wong, Poughkeepsie, NY (US); Fred J. Towler, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/902,813

(22) Filed: Jul. 11, 2001

(65) Prior Publication Data

US 2003/0012067 A1 Jan. 16, 2003

(51) Int. Cl.[7] .................................................. G11C 7/00
(52) U.S. Cl. ........................................ 365/201; 365/208
(58) Field of Search ............................ 365/201, 189.01, 365/203, 174, 208, 156

(56) References Cited

U.S. PATENT DOCUMENTS

| | | | | |
|---|---|---|---|---|
| 4,995,000 A | * | 2/1991 | Terrell | 365/154 |
| 5,034,923 A | * | 7/1991 | Kuo et al. | 365/189.01 |
| 5,276,647 A | | 1/1994 | Matsui et al. | |
| 5,428,574 A | * | 6/1995 | Kuo et al. | 365/201 |
| 5,559,745 A | * | 9/1996 | Banik et al. | 365/201 |
| 5,835,429 A | * | 11/1998 | Schwarz | 365/201 |
| 5,956,279 A | | 9/1999 | Mo et al. | |
| 6,026,011 A | | 2/2000 | Zhang | |
| 6,256,241 B1 | * | 3/2001 | Mehalel | 365/201 |
| 6,216,239 B1 | | 4/2001 | Lien | |
| 6,388,927 B1 | * | 5/2002 | Churchill et al. | 365/201 |

* cited by examiner

Primary Examiner—David Nelms
Assistant Examiner—Thinh Nguyen
(74) Attorney, Agent, or Firm—Ira Blecker; Cantor Colburn LLP

(57) ABSTRACT

A method for determining the memory cell stability of individual memory cells included within a memory array is disclosed. In an exemplary embodiment, the method includes presetting each memory cell to a first logic state and then applying a gradually increasing, controlled leakage current to a node within each memory cell. The voltage of each of the nodes within each corresponding memory cell is then monitored. Then, for each memory cell within the memory array, the level of leakage current which causes the memory cell to be changed from the first logic state to a second logic state is determined. The level of leakage current which causes the memory cell to be changed from the first logic state to the second logic state corresponds to the threshold voltage of a pull-up PFET within the memory cell.

22 Claims, 6 Drawing Sheets

METHOD AND APPARATUS FOR IDENTIFYING SRAM CELLS HAVING WEAK PULL-UP PFETS

BACKGROUND

The present invention relates generally to integrated circuit memory devices and, more particularly, to identifying weak pull-up PFETs contained within a Static Random Access Memory (SRAM) cell.

A typical static random access memory (SRAM) cell includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch which stores the data bit therein so long as power is supplied to the memory array. In a conventional six-transistor cell, a pair of access transistors or pass gates (when activated by a word line) selectively couple the inverters to a pair of complementary bit lines.

As memory devices continue to shrink in size over time, so do the individual cells and hence the individual devices within the cell. One problem associated with SRAM device miniaturization occurs as a result of an unstable threshold voltage ($V_T$) of the PFETs. In a typical six transistor SRAM cell layout, the PFETs are minimally sized in order to allow for maximum array density. A relatively small PFET, in turn, may exhibit an excessively high shift in $V_T$ after module stress. As the $V_T$ of the PFET approaches the supply voltage ($V_{DD}$), the six-transistor cell becomes a dynamic four-transistor cell. Moreover, in a cell with a weak pull-up PFET, a "high" cell node will eventually drift to ground over time, since the NFET to ground current (when the NFET is "off") is the dominating leakage current within the cell. In such a case, a cell which has a "1" bit stored therein may, over time, flip to a "0" bit before a read operation is later performed. The reverse may also be true if both PFETs are weak or if the PFET associated with the complementary bit line is weak.

Unfortunately, during conventional SRAM testing, a cell with a weak PFET(s) may appear healthy. In addition, the SRAM bit line circuitry can accidentally refresh the cell nodes during a read operation, thereby helping to hide the problem. As a selected word line is activated, all cells connected thereto are exposed to the bit line bias, which was set to $V_{DD}$ during a restore operation. If both PFETs within the cell are equally weak, and if the high cell node had drifted down near ground, both cell nodes will be pulled up to about the same level through the passgates. Eventually, if the inactive standby time is long enough, both cell nodes will drift back down toward ground and at about the same voltage level. In such cases where the voltage difference between the left cell node and the right cell node is about zero, the cell is considered to have been disturbed to the "X" state.

During a subsequent read operation, an SRAM cell in the "X" state may or may not fail the test. A cell in the "X" state which passes the test is considered a problematic escapee. If only one of the PFETs is weak, and the cell is at the state where the weak PFET should be turned off, then the defect is virtually undetectable. Unlike a dynamic random access memory (DRAM) cell where the data loss is mainly from the "1" state to the "0" state, an SRAM cell that has lost data may in certain instances be read as a healthy cell. Present screening methods for identifying weak pull-up PFETs, therefore, are a "hit or miss" venture. In practice, some screening methods involve shortening the test cycle time and lowering the power supply $V_{DD}$, thereby trying to make the weak cells fail the write operation. Other existing methods modify the write cycle to allow a "weak write" operation to flip the weak cells. However, these existing weak write operations are too strong, thereby allowing good cells to be screened out by mistake.

BRIEF SUMMARY

The above discussed and other drawbacks and deficiencies of the prior art are overcome or alleviated by a method for determining the memory cell stability of individual memory cells included within a memory array. In an exemplary embodiment, the method includes presetting each memory cell to a first logic state and then applying a gradually increasing, controlled leakage current to a node within each memory cell. The voltage of each of the nodes within each corresponding memory cell is then monitored. Then, for each memory cell within the memory array, the level of leakage current which causes the memory cell to be changed from the first logic state to a second logic state is determined. The level of leakage current which causes the memory cell to be changed from the first logic state to the second logic state corresponds to the threshold voltage of a pull-up PFET within the memory cell.

BRIEF DESCRIPTION OF THE DRAWINGS

Referring to the exemplary drawings wherein like elements are numbered alike in the several Figures.

DETAILED DESCRIPTION

Figure 1:
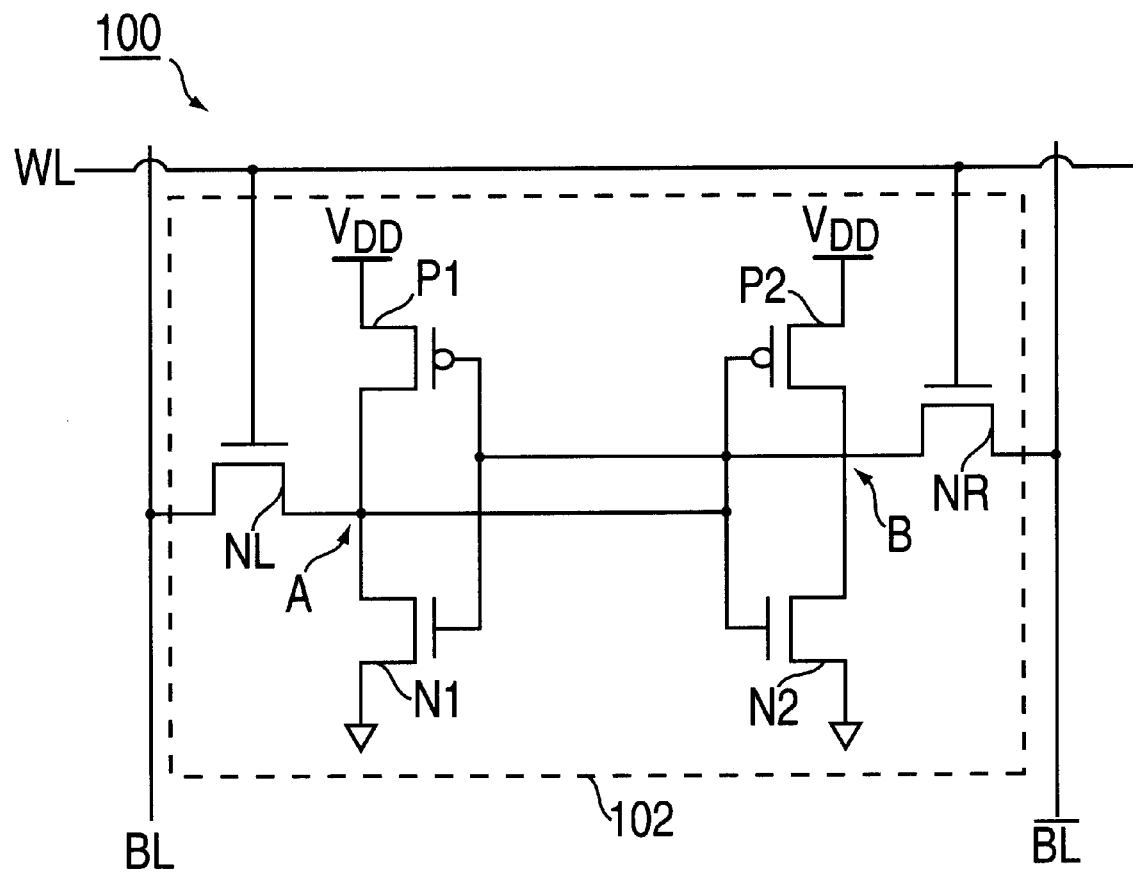
FIG. 1 is a schematic of an existing six-transistor SRAM cell structure.

Referring initially to FIG. 1, there is shown a conventional SRAM cell structure 100 which represents a single memory cell included within a memory array arranged in rows and columns. The SRAM cell structure 100 includes a six-transistor memory cell 102 which is capable of storing a binary bit of information. Specifically, the memory cell includes a pair of cross-coupled, complementary metal oxide semiconductor (CMOS) inverters. One inverter includes an NFET storage transistor N1 and a PFET load transistor P1. Similarly, a second inverter includes an NFET storage transistor N2 and a PFET load transistor P2. Transistors P1 and P2 are often referred to as pull-up transistors because of their coupling to the voltage source $V_{DD}$. The memory cell 102 further contains NMOS access transistors (i.e., passgates) NL and NR serving as switches, each of which are coupled between the bistable circuit (P1, N1, P2 and N2) and a pair of complementary bit lines BL and BR, respectively. Passgates NL and NR are activated by an appropriate signal generated on a word line WL.

The junction node A (i.e., the drains) of transistors P1 and N1, as well as the gates of transistors P2 and N2, are coupled through passgate NL to bit line BL. The junction node B (i.e., the drains) of transistors P2 and N2, as well as the gates of transistors P1 and N1 are coupled through access transistor NR to complementary bit line BR. In the above described SRAM cell structure 100, data is stored as voltage levels within the two sides of the bistable circuit (P1, N1, P2 and N2) in opposite voltage configurations; that is, node A is high and node B is low in one state, and node A is low and the B is high in the other state, thereby resulting in two stable states. Node B is thus the logical complement of node A.

Again, as indicated earlier, in the event that one or both of the PFETs P1, P2 are weak, such a condition may escape detection in conventional SRAM testing and thus effectively result in a "dynamic" SRAM which (unless periodically refreshed) may lose data over a sustained period of inactivity.

Figure 2:
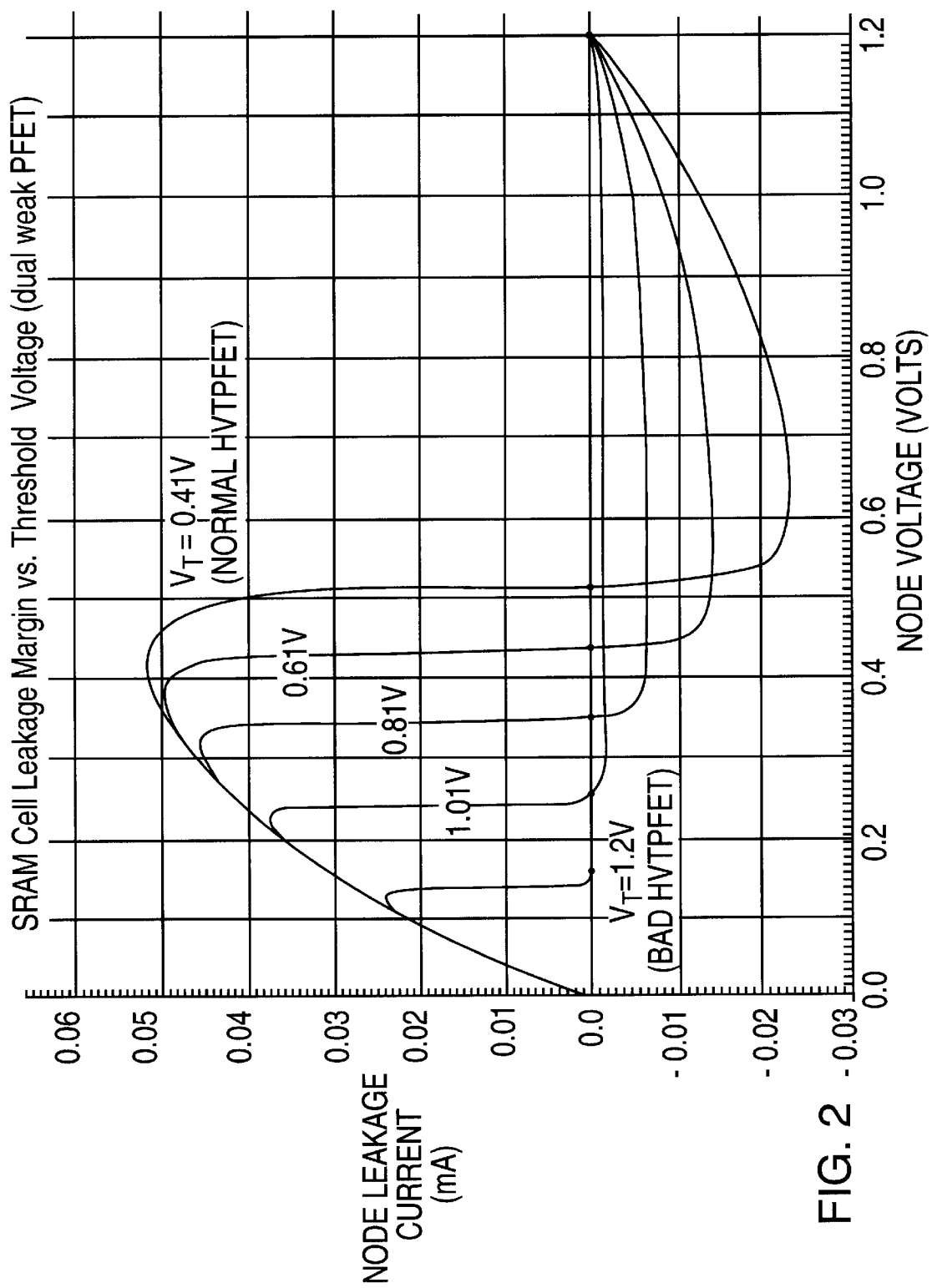
FIG. 2 is a graph which illustrates the noise margin of a given SRAM cell as a function of the threshold voltage ($V_T$) of the PFETs therein.

FIG. 2 is a graph which illustrates the noise margin (i.e., tolerable leakage current versus voltage) of a given SRAM cell as a function of the threshold voltage ($V_T$ or $V_{TP}$) of the PFETs therein. As the threshold voltage $V_T$ (defined as the difference between the supply voltage $V_{DD}$ and the gate to source voltage $V_{GS}$ which causes the PFET to conduct) increases, the cell noise margin degrades. In other words, as $V_T$ increases, the cell node is less tolerant to outward leakage current (and inward leakage current in the case of two bad PFETS).

The "N-curves" shown in FIG. 2 are determined by isolating the cell from the bit lines and then forcing the cell node voltage from ground to $V_{DD}$ (approximately 1.2 volts) with an external voltage source. As the cell node voltage is switched from ground to $V_{DD}$, the current from and to the voltage source is plotted. In each plot, the current from the voltage source is positive, while the current to the voltage source is negative. The middle zero-current intercept represents the metastable state of the cell, which drifts to the "0" state to the left or the "1" state to the right if disturbed. The positive portion of each curve represents the cell tolerance of leakage current into the node when the node is in the low or "0" state. If an SRAM cell contains two bad cells therein, the inward leakage current tolerance may be as low as 24 µA for a cell to flip from "0" to "1".

Similarly, when the data stored in the cell node is high or in the "1" state, the negative current values (on the right portion of each curve) represent the current leakage that the cell can tolerate without losing the data. In the case of a healthy cell having PFETs with a $V_T$ of about 0.4 volts, for example, it can be seen that the cell will tolerate up to about 25 µA of NFET leakage current. However, as $V_T$ starts to increase, the leakage current tolerance (and thus cell stability) decreases. For example, if $V_T$ of one or both of the PFETs is about 0.8 volts, it may still be within an acceptable range, but it can be seen that the leakage current tolerance is reduced to about 6 µA. Further, if the PFET threshold voltage $V_T$ is high enough such that it equals the supply voltage $V_{DD}$, there is zero leakage tolerance and any NFET leakage current will eventually pull a high node down to ground.

Figure 3:
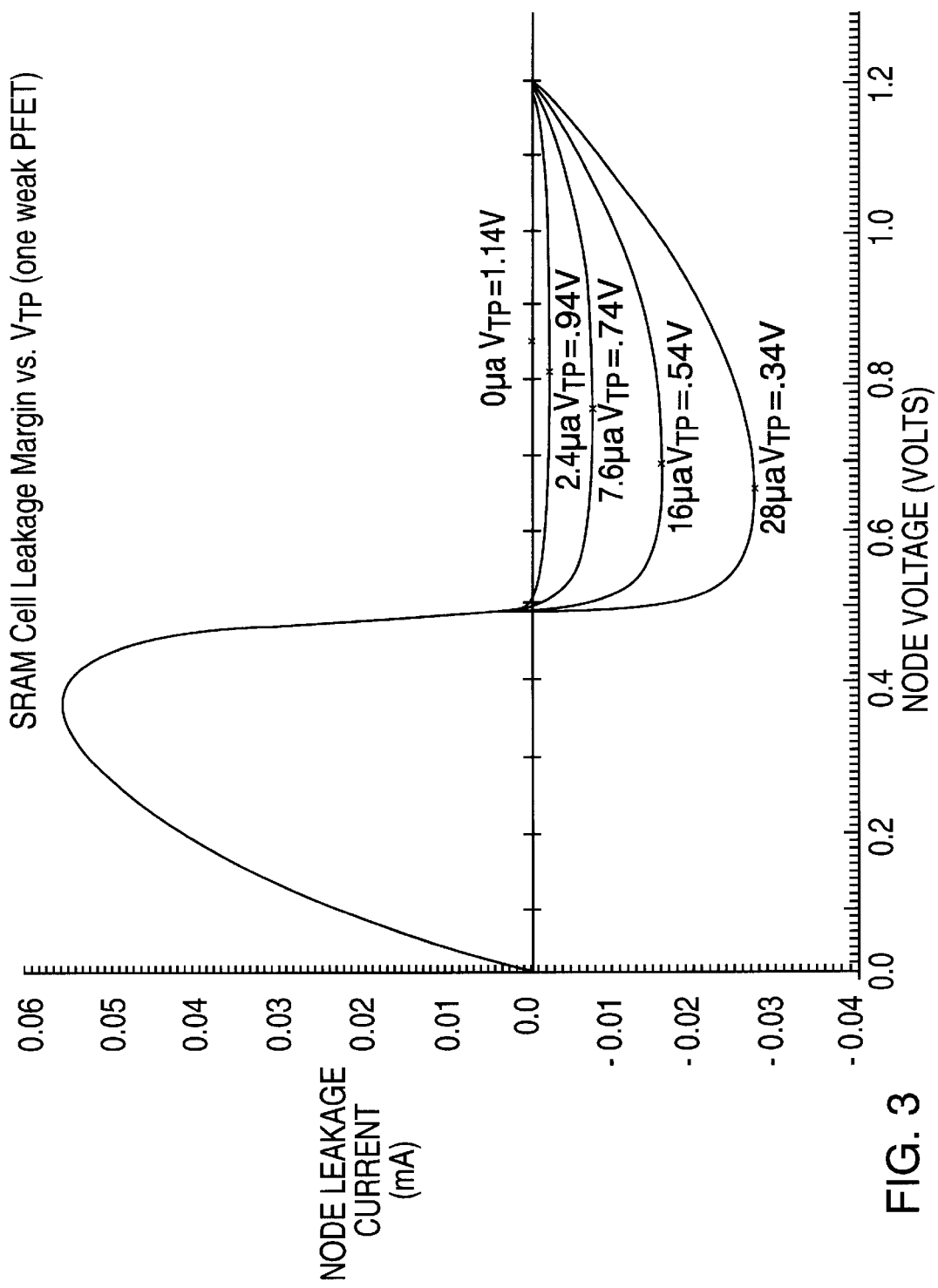
FIG. 3 is another graph which illustrates the noise margin of a given SRAM cell as a function of the threshold voltage ($V_T$) of the PFETs therein.

FIG. 3 is another graph illustrating the noise margin characteristics of an SRAM cell where only one of the two PFETs are weak. In this case, the logic state where the weak PFET should be "off" is as stable as that in a normal good cell. Thus, the left side of the curves shown in FIG. 3 (representing the leakage tolerance to inward leakage current) is substantially the same regardless of the threshold voltage of the weak PFET. On the other hand, a high threshold voltage in just one of the two cell PFETs will still result in a decreased leakage current tolerance for a cell node at the high logic value.

Therefore, in accordance with an embodiment of the invention, a test circuit is provided which not only provides a method for identifying "good" and "bad" pull-up PFETs, but which also provides a method for identifying the specific distribution of threshold voltages for all PFETs within a memory array such as an SRAM.

Figure 4:
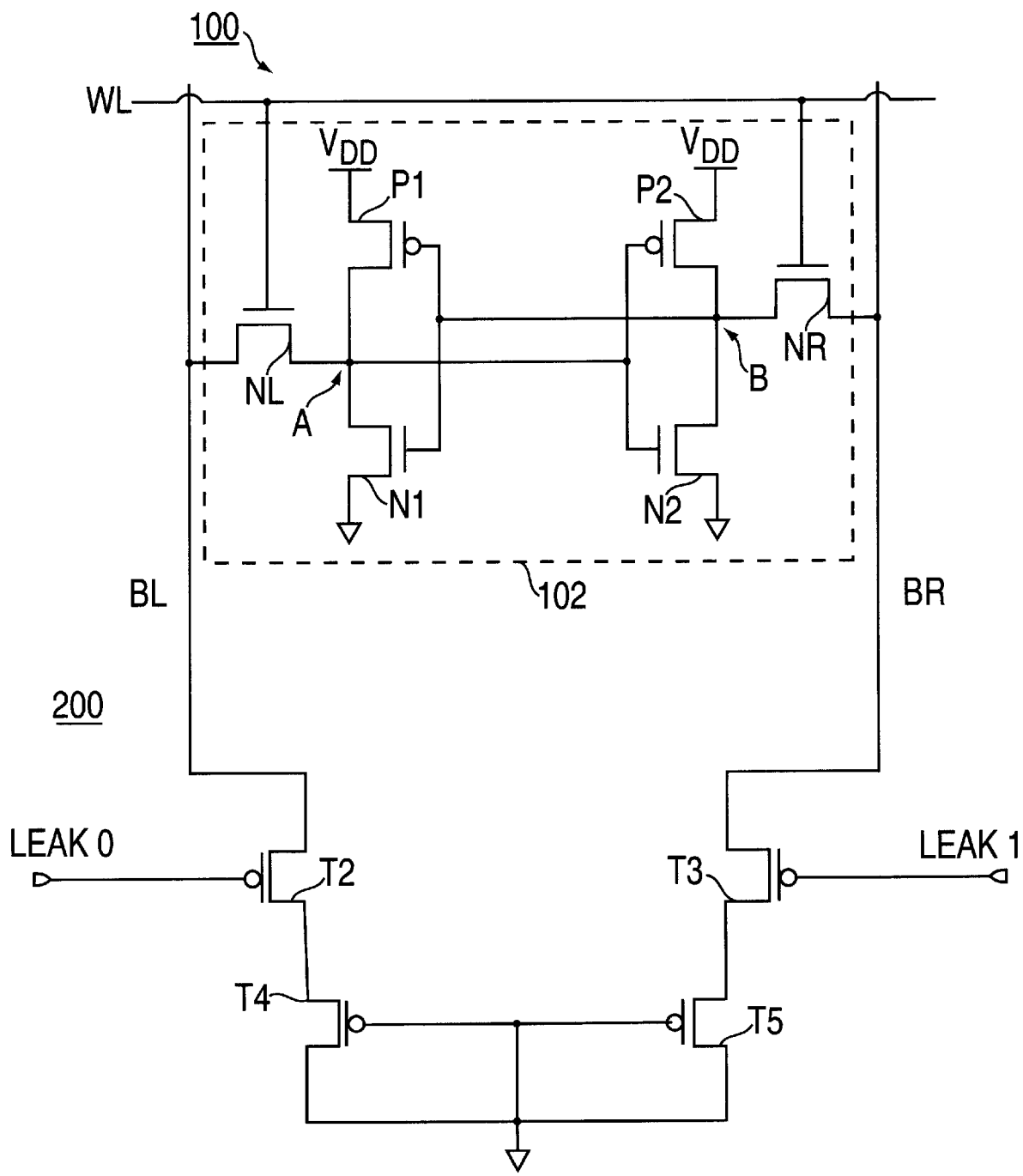
FIG. 4 is a schematic of a screening circuit coupled to the SRAM cell of FIG. 1, in accordance with an embodiment of the invention.

Referring now to FIG. 4, there is shown a test circuit 200 which is included within each bit column in the memory array. Test circuit 200 may be characterized as a current source which provides a leakage current path for the internal cell junction nodes A and B. In this manner, the precise threshold voltage for both PFETs within each memory cell may be determined. Test circuit 200 includes a first pull-down leakage transistor T4, and a second pull-down leakage transistor T5. Transistors T2 and T4 provide pull-down leakage for junction node A through input terminal LEAK 0, while T3 and T5 provide pull-down leakage for junction node B through input terminal LEAK 1. Effectively, T2 is a pass gate which selectively couples pull-down transistor T4 to BL, and T3 is a pass gate which selectively couples pull-down transistor T5 to BR. In a preferred embodiment, transistors T2, T3, T4 and T5 comprise PFET transistors to allow for a smaller layout; however, it will also be appreciated that NFETs may also be used to provide a more elaborate leakage current source with precise control.

In order to determine the threshold voltage $V_T$ of P1 in each cell within a given column, each cell within the column is first initialized to the "1" state. That is, junction node A has an initial voltage of $V_{DD}$ (e.g., 1.2 volts). A control signal applied to LEAK 0 will then implement a soft write "0" function by causing T2 to conduct, thereby generating a pull-down current through T4 to ground. Thus, if the magnitude of the applied leakage current exceeds the leakage tolerance of P1 (depending upon its threshold voltage), the voltage value at junction node A will be flipped to the "0" state.

Similarly, the threshold voltage of P2 may be determined by initializing junction node B to the "1" state and applying a control signal to input terminal LEAK 1. This time, a leakage current is drawn from junction node B, through complementary bit line BR and transistors T3 and T5, to ground. It will be noted that in applying the leakage current to each cell junction node A and B, the word line WL is activated so that the junction nodes are coupled to the bit line pair.

In one aspect, test circuit 200 may be used to screen out PFETs having a $V_T$ above a certain predefined value by applying a particular voltage value to LEAK 0 and LEAK 1. For example, if the input voltage at LEAK 0 were selected such that T2 were to draw about 10 µA of controlled leakage current from junction node A, this soft write function would screen out those PFETs P1 having a $V_T$ of greater than 0.6 volts. This will be understood by recalling from FIG. 2 that a cell PFET with a $V_T$ of about 0.61 volts has a maximum leakage current tolerance of about 14 µA, whereas a cell PFET with a $V_T$ of about 0.81 volts has a maximum leakage current tolerance of about 6 µA. Because a cell PFET with a $V_T$ of about 0.61 volts will tolerate a leakage current of 10 µA without allowing a "1" bit stored in the junction node to be flipped or lost, those PFETs having threshold voltages which are unacceptably higher will be screened out. The cell voltage at junction node A is monitored during the application of controlled leakage current thereto. If the data is lost as a result of the application of a leakage current, then the PFET P1 has a threshold voltage greater than 0.61 volts.

In another aspect, test circuit 200 may also be configured for (in addition to establishing a pass/fail status for a PFET) determining the threshold voltage of each PFET to determine a distribution of $V_T$ values throughout the entire SRAM array. Rather than applying a preset input voltage value to LEAK 0 and LEAK 1 (and thus drawing a fixed leakage current), a range of input voltages may be applied thereto. By starting at a very small input voltage and drawing a very small leakage current at the outset (e.g., on the order of nanoamperes), those PFETs with the highest threshold voltages will first be determined and measured. Then, the threshold current may be gradually increased until each cell node voltage begins to flip from the "1" state to the "0" state. The value of the threshold voltage for a given PFET will be determined by the amount of leakage current which caused the cell to flip from high to low.

Figure 5:
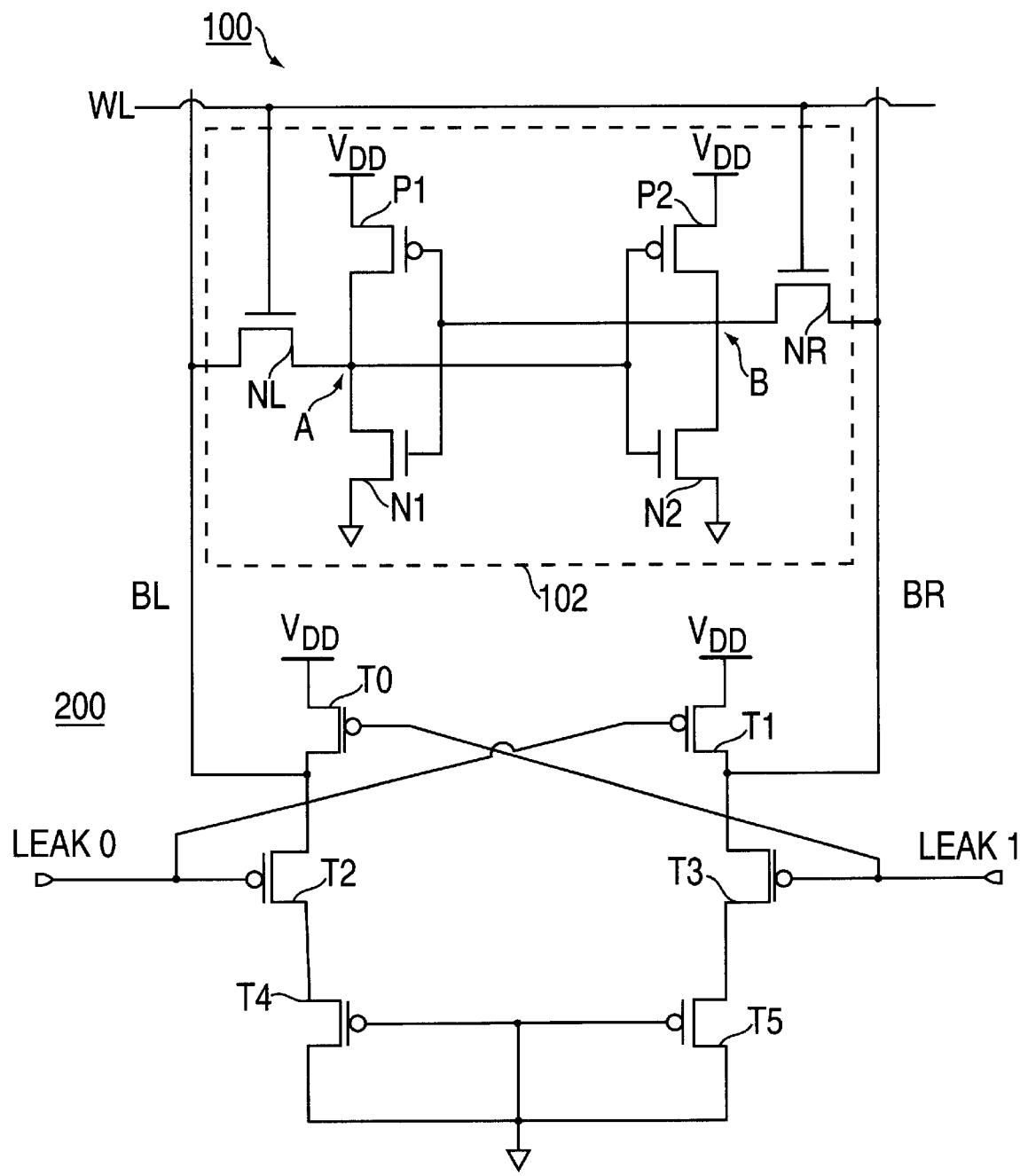
FIG. 5 is an alternative embodiment of the screening circuit in FIG. 4.

FIG. 5 illustrates an alternative embodiment of the test circuit 200 shown in FIG. 4. In order to prevent any latching circuits connected to the bit columns from masking off the leakage current control, pull-up PFETs T0 and T1 are used to selectively couple BL and BR, respectively, to the supply voltage $V_{DD}$. Passgate T2 (in addition to selectively coupling T4 to BL) selectively couples pull-up transistor T0 to BL, while passgate T3 (in addition to selectively coupling T5 to BR) selectively couples pull-up transistor T1 to BR. During a soft write "0" test operation while current from BL is being pulled down, BR is thus held at $V_{DD}$, since the signal applied at LEAK 0 is also connected to the gate of T1, thereby coupling BR to $V_{DD}$. This is so, despite the pull-down effect of N2, since T1 is much larger than N2. Conversely, during a pull-down test on junction node B, bit line BL is held to $V_{DD}$ through transistor T0.

Figure 6:
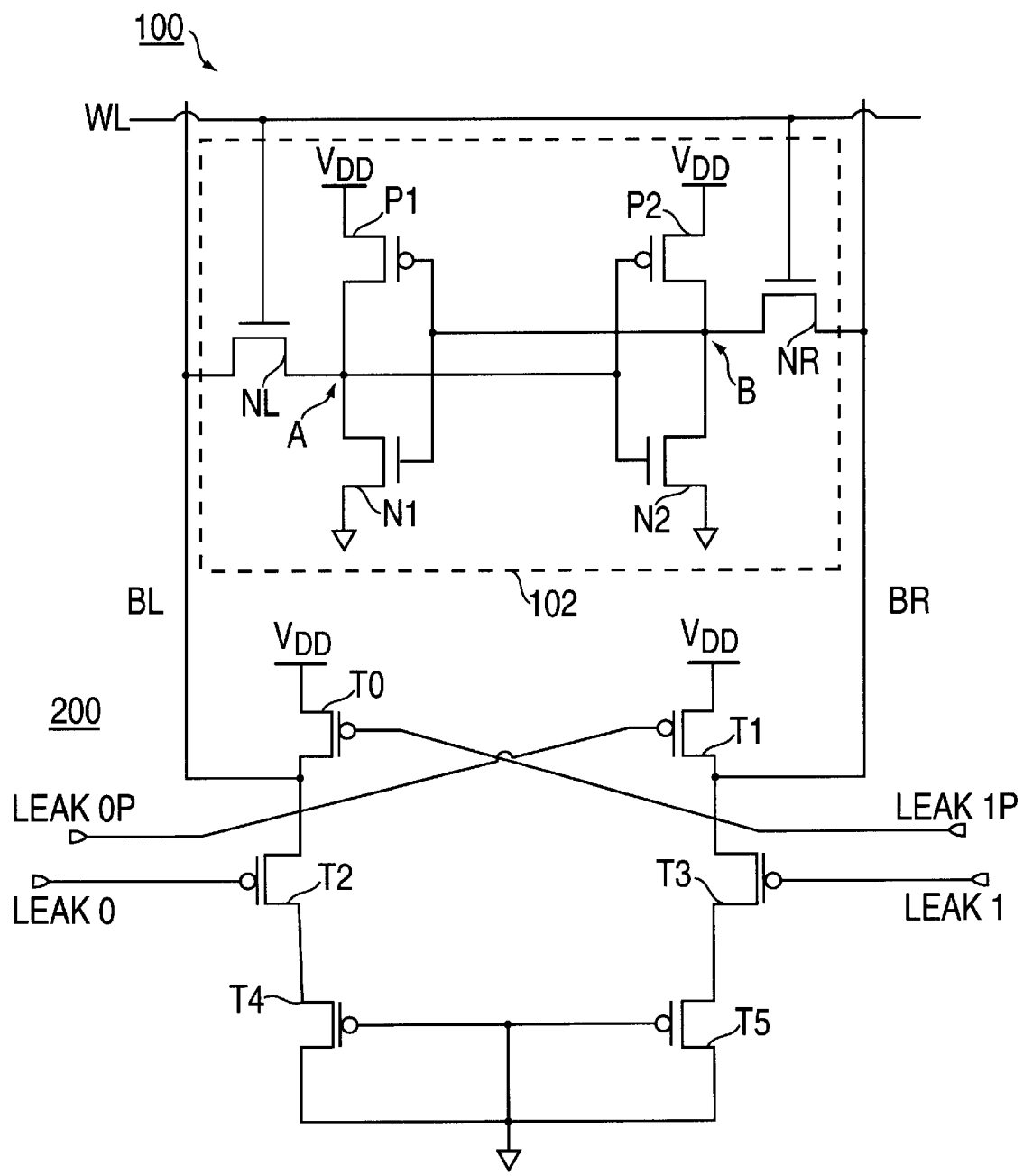
FIG. 6 is an alternative embodiment of the screening circuit in FIG. 5.

FIG. 6 illustrates still an alternative embodiment for the test circuit 200 in FIG. 5. In this embodiment, an additional pair of input terminals LEAK 0P and LEAK 1P are used in order to separate a pull-down signal from the complementary pull-up signal, and can originate from a separate chip pad. Thus configured, test circuit 200 provides a sufficient pull-up to counteract any NFET pull-down effects which might otherwise result in the complementary side from being pulled toward ground and confuse the screening process.

Through the above described embodiments, the test circuit 200 may be used to qualify individual pull-up PFETs within a memory cell as "good" or "bad", as well as to determine the distribution of threshold voltages thereof for each PFET in the array. In the latter case, such information may prove to be quite useful in analyzing the overall technology process control. It will also be appreciated that the disclosed method and apparatus embodiments may also be applied in principle to an instance where it is desired to screen for possible weak pull-down NFETs in SRAM cells (e.g., N1 and N2). Although as a practical matter, it is the PFETs that are susceptible to weakness during the manufacturing process thereof, the testing process may nonetheless apply to the NFETs.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for testing the operation of an individual memory cell included within a memory array, the method comprising:

presetting the memory cell to a first logic state;

applying an adjustably controlled leakage current to a node within the memory cell; and monitoring the voltage of said node;

wherein the individual memory cell is determined to be defective if said leakage current causes said memory cell to be changed from said first logic state to a second logic state.

2. The method of claim 1, wherein said presetting the memory cell to a first logic state further comprises:

coupling a bit line to a power supply voltage, thereby charging said bit line to a logic high voltage; and coupling said bit line to said node, thereby storing said logic high voltage within said node.

3. The method of claim 2, wherein said applying a controlled leakage current to said node further comprises:

coupling said node, through said bit line, to a first pull-down transistor, said first pull-down transistor being activated by a signal applied to a first input terminal; and coupling a complementary node within the cell, through a complementary bit line, to a first pull-up transistor, said first pull-up transistor also being activated by said signal applied to said first input terminal.

4. The method of claim 3, wherein said first pull-up transistor is also activated by said signal applied to said first input terminal.

5. The method of claim 3, wherein said first pull-up transistor is activated by a signal applied to a second input terminal.

6. The method of claim 3, further comprising:

presetting the memory cell to a second logic state;

applying a controlled leakage current to said complementary node within the memory cell; and monitoring the voltage of said complementary node;

wherein the individual memory cell is determined to be defective if said leakage current causes said memory cell to be changed from said second logic state to said first logic state.

7. The method of claim 6, wherein said applying a controlled leakage current to said complementary node further comprises:

coupling said complementary node, through said complementary bit line, to a second pull-down transistor, said second pull-down transistor being activated by a signal applied to a third input terminal; and coupling said node, through said bit line, to a second pull-up transistor, said second pull-up transistor also being activated by said signal applied to said third input terminal.

8. The method of claim 7, wherein said second pull-up transistor is also activated by said signal applied to said third input terminal.

9. The method of claim 7, wherein said second pull-up transistor is activated by a signal applied to a fourth input terminal.

10. The method of claim 7, wherein said first and second pull-down transistors and said first and second pull-up transistors comprise PFETs.

11. A method for determining the memory cell stability of individual memory cells included within a memory array, the method comprising:

presetting each memory cell to a first logic state;

applying a gradually increasing, controlled leakage current to a node within each memory cell; and monitoring the voltage of each of said nodes within each corresponding memory cell; and for each memory cell within the memory array, determining the level of leakage current which causes the memory cell to be changed from said first logic state to a second logic state.

12. The method of claim 11, further comprising:

for each memory cell within the memory array, determining the threshold voltage for a PFET pull-up transistor associated with each memory cell.

13. The method of claim 11, wherein said applying a controlled leakage current further comprises:

coupling said node, through said bit line, to a first pull-down transistor included within a test circuit, said first pull-down transistor being activated by a signal applied to a first input terminal connected to said test circuit; and coupling a complementary node within the cell, through a complementary bit line, to a first pull-up transistor within said test circuit, said first pull-up transistor also being activated by said signal applied to said first input terminal.

14. The method of claim 12, wherein the threshold voltage for each of said PFET pull-up transistors in said memory cells corresponds to the level of leakage current which causes the memory cell to be changed from said first logic state to said second logic state.

15. A test circuit for a memory device, the memory device having at least one memory cell, a bit line and a complementary bit line, the test circuit comprising:

a first pull-down transistor;

a second pull-down transistor;

a first pull-up transistor;

a second pull-up transistor;

a first pass gate, said first pass gate selectively coupling said first pull-down transistor to the bit line; and a second pass gate, said second pass gate selectively coupling said second pull-down transistor to the complementary bit line;

said first and second pass gates further being capable of adjustably controlling a preselected magnitude of leakage current applied to the memory cell during a test thereof.

16. The test circuit of claim 15, wherein:

said first and second pull-down transistors, said first and second pull-up transistors and said first and second pass gates comprise PFETs.

17. The test circuit of claim 15, wherein the memory device is a static random access memory (SRAM).

18. The test circuit of claim 15, wherein:

said first pass gate further selectively couples said first pull-up transistor to the complementary bit line; and said second pass gate further selectively couples said second pull-up transistor to the bit line.

19. A computer memory device, comprising:

an array of individual memory cells, arranged in rows and columns; and a plurality of test circuits, coupled to each of said columns, each of said plurality of test circuits further comprising:

a first pull-down transistor;

a second pull-down transistor;

a first pull-up transistor;

a second pull-up transistor;

a first pass gate, said first pass gate selectively coupling said first pull-down transistor to a bit line associated with each column; and a second pass gate, said second pass gate selectively coupling said second pull-down transistor to a complementary bit line associated with each column;

said first and second pass gates further being capable of controlling a preselected magnitude of leakage current applied to the memory cell during a test thereof.

20. The computer memory device of claim 19, wherein:

said first and second pull-down transistors, said first and second pull-up transistors and said first and second pass gates comprise PFETs.

21. The computer memory device of claim 19, wherein said array comprises a static random access memory (SRAM).

22. The test circuit of claim 19, wherein:

said first pass gate further selectively couples said first pull-up transistor to the complementary bit line; and said second pass gate further selectively couples said second pull-up transistor to the bit line.

* * * * *